(12) United States Patent
Camillo-Castillo et al.

(10) Patent No.: US 8,598,660 B2
(45) Date of Patent: Dec. 3, 2013

(54) STRESS ENHANCED LDMOS TRANSISTOR TO MINIMIZE ON-RESISTANCE AND MAINTAIN HIGH BREAKDOWN VOLTAGE

(75) Inventors: Renata Camillo-Castillo, Essex Junction, VT (US); Erik Mattias Dahlstrom, Burlington, VT (US); Robert J. Gauthier, Jr., Hinesburg, VT (US); Ephrem G. Gebreselasie, South Burlington, VT (US); Richard A. Phelps, Colchester, VT (US); Jed Hickory Rankin, Richmond, VT (US); Yun Shi, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 13/150,612

(22) Filed: Jun. 1, 2011

(65) Prior Publication Data
US 2012/0306014 A1   Dec. 6, 2012

(51) Int. Cl.
| | |
|---|---|
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |

(52) U.S. Cl.
USPC ............ 257/343; 257/335; 257/401; 257/341

(58) Field of Classification Search
USPC ......... 257/343, 335, 337, 341, 401, 336, 328, 257/339, 369, 409, 493, 342, 330, 338
See application file for complete search history.

(56) References Cited

U.S. PATENT DOCUMENTS

| | | | |
|---|---|---|---|
| 6,144,069 A | 11/2000 | Tung | |
| 7,151,296 B2 | 12/2006 | Wu et al. | |
| 7,315,067 B2 | 1/2008 | Wang | |
| 7,465,620 B2 | 12/2008 | Ko et al. | |
| 7,504,704 B2 | 3/2009 | Currie et al. | |
| 7,645,651 B2 | 1/2010 | Huang et al. | |

(Continued)

OTHER PUBLICATIONS

Masao Kondo, et al. "Strained-silicon MOSFETs for Analog Applications: Utilizing a Supercritical-Thickness Strained Layer for Low Leakage Current and High Breakdown Voltage," IEEE Transactions on Electron Devices, vol. 53, No. 5, pp. 1226-1234, May 2006.

Masao Kondo, et al. "Thick-Strained-Si/Relaxed-SiGe Structure of High-Performance RF Power LDMOSFETs for Cellular Handsets," IEEE Transactions on Electron Devices, vol. 53, No. 12, pp. 3136-3145, Dec. 2006.

(Continued)

*Primary Examiner* — Chuong A. Luu
(74) *Attorney, Agent, or Firm* — Abdul-Samad Adediran; Michael Lestrange

(57) ABSTRACT

A lateral diffused metal-oxide-semiconductor field effect transistor (LDMOS transistor) employs a stress layer that enhances carrier mobility (i.e., on-current) while also maintaining a high breakdown voltage for the device. High breakdown voltage is maintained, because an increase in doping concentration of the drift region is minimized. A well region and a drift region are formed in the substrate adjacent to one another. A first shallow trench isolation (STI) region is formed on and adjacent to the well region, and a second STI region is formed on and adjacent to the drift region. A stress layer is deposited over the LDMOS transistor and in the second STI region, which propagates compressive or tensile stress into the drift region, depending on the polarity of the stress layer. A portion of the stress layer can be removed over the gate to change the polarity of stress in the inversion region below the gate.

11 Claims, 8 Drawing Sheets

(56) References Cited

U.S. PATENT DOCUMENTS

| | | |
|---|---|---|
| 7,795,681 B2 | 9/2010 | Williams et al. |
| 2006/0278923 A1 | 12/2006 | Dudek et al. |
| 2008/0014690 A1 | 1/2008 | Chu et al. |
| 2008/0026523 A1* | 1/2008 | Lee et al. ............ 438/231 |
| 2009/0045462 A1 | 2/2009 | Ren et al. |
| 2009/0321825 A1 | 12/2009 | Chen et al. |

OTHER PUBLICATIONS

P. Moens, et al. "Stress-Induced Mobility Enhancement for Integrated Power Transistors," Electron Devices Meeting, 2007. IEDM 2007. IEEE International, pp. 877-880, Dec. 10-12, 2007.

U. Aghoram, et al. "Effect of mechanical stress on LDMOSFETs: Dependence on orientation and gate bias," Power Semiconductor Devices & IC's, 2009. ISPSD 2009. pp. 220-223, 21st International Symposium on Jun. 14-18, 2009.

* cited by examiner

STRESS ENHANCED LDMOS TRANSISTOR TO MINIMIZE ON-RESISTANCE AND MAINTAIN HIGH BREAKDOWN VOLTAGE

TECHNICAL FIELD

The present invention relates to a semiconductor device, and more particularly to a stress enhanced lateral diffused metal-oxide-semiconductor field effect transistor with reduced on-resistance.

BACKGROUND

Lateral diffused metal-oxide-semiconductor field effect transistors (LDMOS transistors) are often utilized for high-voltage applications. Thus, it is desirable that LDMOS transistors possess higher breakdown voltages in order to support other electrical devices that operate at high voltages. Breakdown voltage is the voltage level at which an uncontrollable increase in current through the LDMOS transistor occurs. Advancements are continuously being made in the technology for fabrication of semiconductors, and the advancements are resulting in smaller LDMOS transistors with reduced on-resistance and enhanced circuit performance. However, a reduction of on-resistance can lead to a reduction of breakdown voltage. A reduction of breakdown voltage diminishes the utility and performance of LDMOS transistors in high-voltage applications. Accordingly, there is a tradeoff between lower on-resistance and higher breakdown voltage. An object of the present invention is to reduce on-resistance and maintain higher breakdown voltages for LDMOS transistors, which sustains the utility and performance of the LDMOS transistors in high-voltage applications.

SUMMARY

The present invention relates to a structure and method of forming lateral diffused metal-oxide-semiconductor field effect transistors (LDMOS transistors) utilizing a stress layer to reduce on-resistance and maintain higher breakdown voltages for the LDMOS transistors, which sustains the utility and performance of LDMOS transistors in high-voltage applications.

In one aspect, embodiments of the invention provide a semiconductor device with a substrate, and a method for forming the semiconductor device with the substrate. A well region is formed in the substrate. A first shallow trench isolation region is formed on and adjacent to the well region. A source region is formed on the well region and adjacent to the first shallow trench isolation region. A lightly doped drift region is formed in the substrate adjacent to the well region, which functions as a resistive layer through which current passes. A second shallow trench isolation region is formed on and adjacent to the drift region. A drain region is formed on the drift region and adjacent to the second shallow trench isolation region. A gate is formed between the source region and the drain region. A sidewall spacer is formed adjacent to sidewalls of the gate. A stress layer is deposited over the semiconductor device, wherein the stress layer is also deposited inside the second shallow trench isolation region. The stress layer is utilized to improve on-resistance and maintain a high breakdown voltage for the semiconductor device. On-resistance is improved, because the stress layer provides increased carrier mobility through the drift region and channel region. Moreover, high breakdown voltage is maintained, because carrier mobility is increased without increasing the doping level in the drift region. Thus, on-resistance is decoupled from breakdown voltage, because the doping level in the drift region does not have to be increased in order to obtain a high breakdown voltage.

BRIEF DESCRIPTION OF THE SEVERAL VIEWS OF THE DRAWINGS

The subject matter which is regarded as an embodiment of the present invention is particularly pointed out and distinctly claimed in the claims at the conclusion of the specification. One manner in which recited features of an embodiment of the present invention can be understood is by reference to the following detailed description of embodiments, taken in conjunction with the accompanying drawings in which:

Figure 1A:
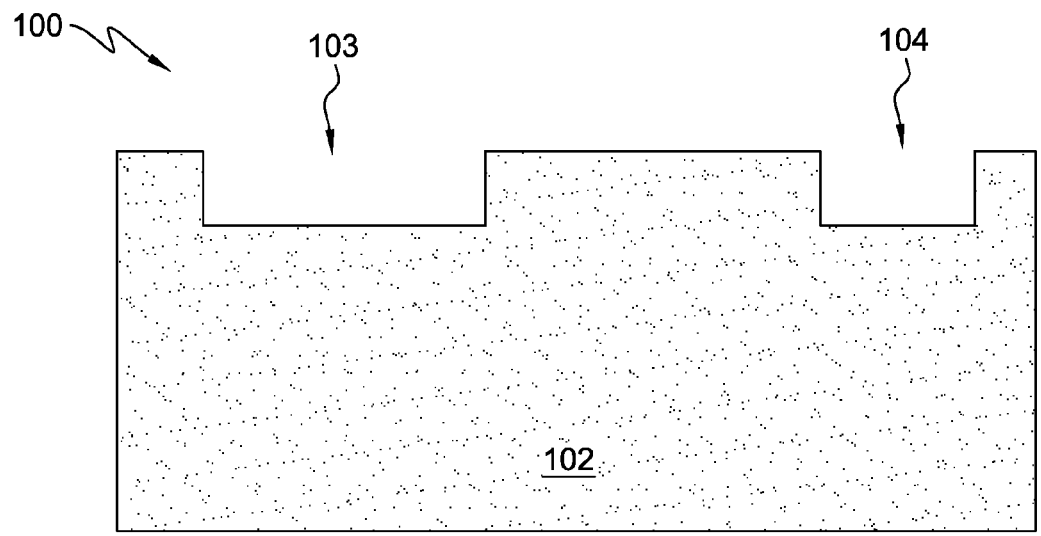
FIGS. 1A-1J are cross-sectional views of semiconductor structures at various stages during the fabrication of a stress enhanced LDMOS transistor according to one embodiment of the present invention.

The drawings are not necessarily to scale. The drawings, which are merely pictorial cross-sectional views, are not intended to portray specific parameters of the invention. The drawings are intended to depict only typical embodiments of the invention, and therefore, should not be considered as limiting the scope of the invention. In the drawings, like numbering represents like elements.

DETAILED DESCRIPTION

Exemplary embodiments now will be described more fully herein with reference to the accompanying drawings. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Moreover, although the embodiments depicted herein are shown in two dimensional views with various regions having width and depth, it should be clearly understood that these regions are illustrations of only a portion of a single unit of a device, which may include a plurality of such units arranged in three-dimensional structures.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

In addition, it will be understood that when an element as a layer, region, dielectric, or substrate is referred to as being "on", "over", "disposed on", "disposed over", "deposited on", or "deposited over" another element, it can be directly on the other element or intervening elements may also be present. In contrast, when an element is referred to as being "directly on", "directly over", or "disposed proximately to" another element, there are no intervening elements present. Furthermore, it will be understood that when an element as a layer, region, dielectric, or substrate is referred to as being "adjacent to" or "disposed adjacent to" another element, it can be directly adjacent to the other element or intervening elements may be present. In contrast, when an element is referred to as being "directly adjacent to" another element, there are no intervening elements present. Moreover, it will be understood that when an element as a layer, region, dielectric, or substrate is referred to as being "on and adjacent to" or "disposed on and adjacent to" another element, it can be directly on and adjacent to the other element or intervening elements may be present. In contrast, when an element is referred to as being "directly on and adjacent to" another element, there are no intervening elements present. Lastly, it will also be understood that when an element is referred to as being "connected" or "coupled" to another element, it can be directly connected or directly coupled to the other element, or intervening elements may be present. In contrast, when an element is referred to as being "directly connected" or "directly coupled" to another element, there are no intervening elements present.

Embodiments of the present invention provides a lateral diffused metal-oxide-semiconductor field effect transistor (LDMOS transistor) utilizing a stress layer to reduce on-resistance and maintain a higher breakdown voltage for the LDMOS transistor, which can be a key enabler for the utility and performance of the LDMOS transistor in high-voltage applications.

FIG. 1A illustrates a cross-sectional view of semiconductor 100, wherein openings 103-104 are formed in substrate layer 102. Semiconductor 100 is an n-type LDMOS transistor thus substrate layer 102 is a boron doped p-type substrate. However, other dopants including boron difluoride (BF2) or indium may be utilized to form substrate layer 102. In alternative embodiments, semiconductor 100 can be formed as a p-type LDMOS transistor by interchanging all p-type and n-type dopants for source regions, well regions, body contacts, drain regions, and drift regions that are formed at subsequent stages in the fabrication process. However, unless otherwise indicated, semiconductor 100 is an n-type LDMOS transistor.

Figure 1B:
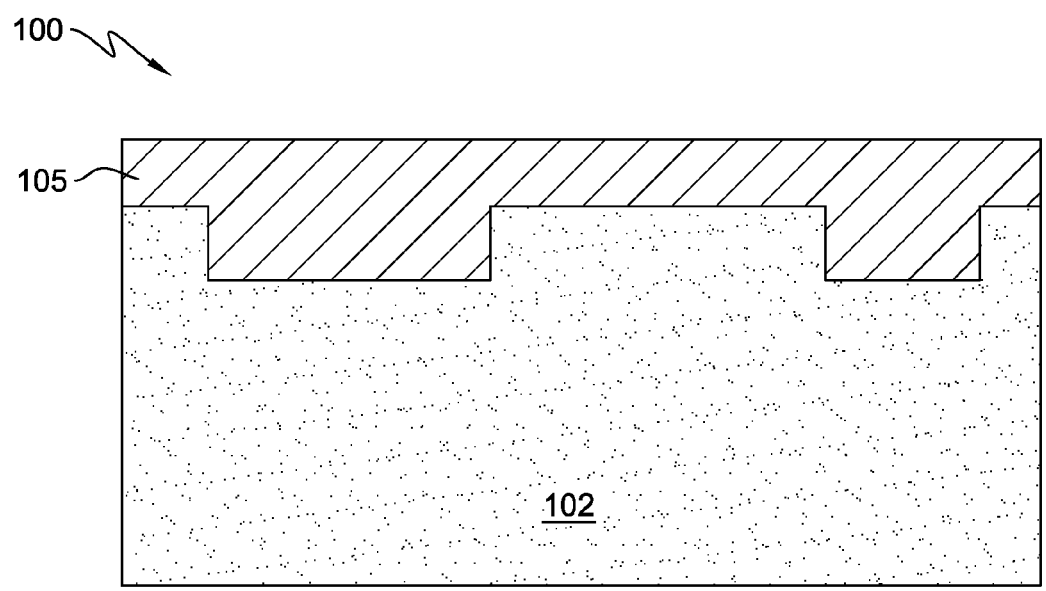
Figure 1C:
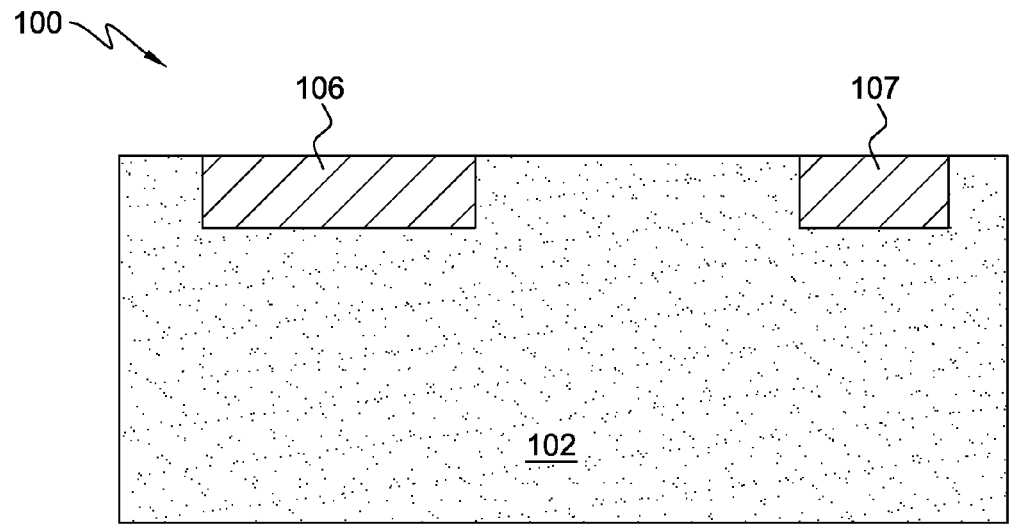

FIG. 1B illustrates a shallow trench isolation (STI) dielectric layer 105 formed in openings 103-104 (shown in FIG. 1A) and over substrate layer 102, wherein the STI dielectric layer can include oxide, nitride, or any other practical dielectric material. Subsequently, in FIG. 1C, a chemical-mechanical planarization (CMP) process is performed on STI dielectric layer 105 (shown in FIG. 1B), wherein a portion of the STI dielectric layer is removed, forming shallow trench isolation (STI) regions 106-107 in openings 103-104 (shown in FIG. 1A), respectively. Additional STI regions can be formed in substrate 102 to electrically isolate semiconductor devices formed on the substrate, which can mitigate unintended short circuiting between the semiconductor devices. In the present embodiment, a CMP process is used to planarize STI dielectric layer 105 to the surface of substrate layer 102. However, in alternative embodiments, any other practical planarization process can be utilized to planarize (i.e., remove a portion of) STI dielectric layer 105.

Figure 1D:
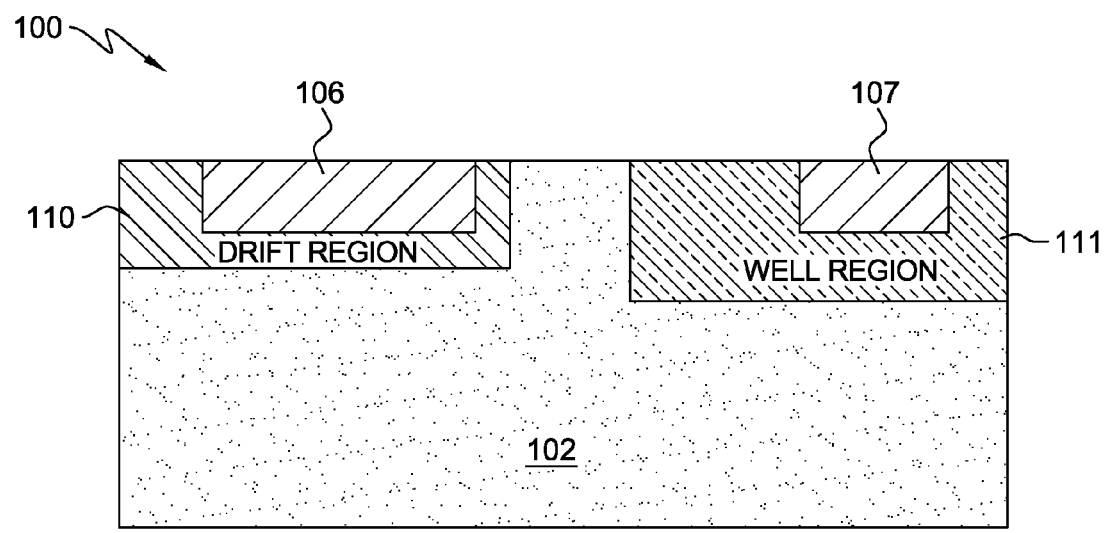

FIG. 1D illustrates the formation of drift region 110 and well region 111 utilizing techniques that include ion implantation or rapid thermal processing (RTP). Drift region 110 can be spaced from well region 111 a distance of about 1-2 microns in order to achieve reduced on-resistance while still maintaining a high breakdown voltage. Thus, the distance of about 1-2 microns defines the length of the channel region under gate 116 (shown below in FIG. 1E). In addition, low on-resistance improves switching speed. Specifically, to form drift region 110, a photoresist layer and an implant mask can be utilized to selectively dope drift region 110 with impurities that can include boron or boron difluoride (BF2). Drift region 110 functions as a resistive layer that current passes through. Doping drift region 110 with impurities, for example boron or BF2, reduces the resistance of the drift region. The added impurities to drift region 110 lowers on-resistance and increase current flow through the drift region. Moreover, to form well region 111, a photoresist layer and an implant mask can be utilized to selectively dope the well region with impurities that can include phosphorus, arsenic, or antimony. The added impurities to well region 111 influence the threshold voltage of the device, because the impurities increase the threshold voltage required to make the channel region conduct.

Figure 1E:
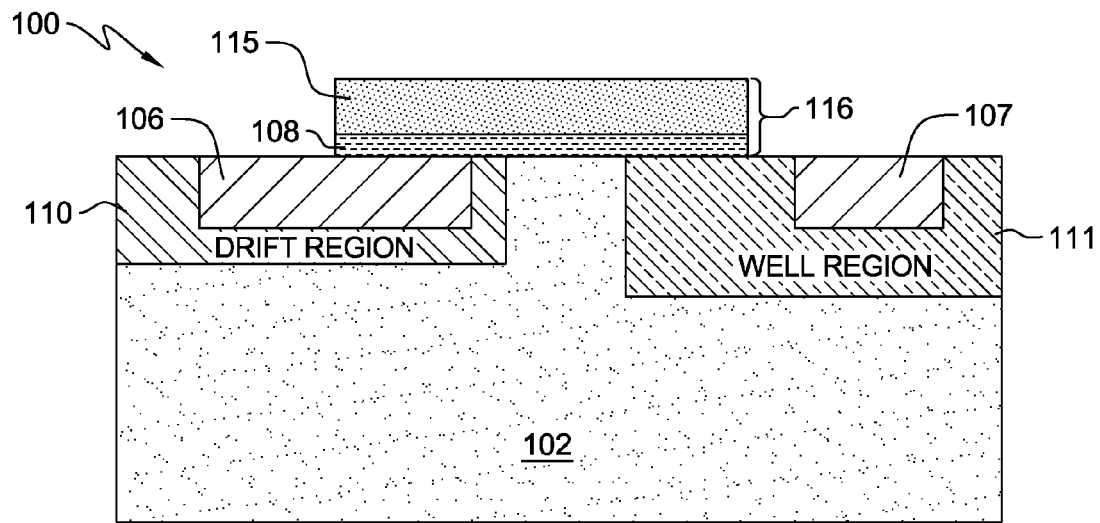

FIG. 1E illustrates the formation of a gate 116 of semiconductor 100. Gate 116 includes a gate dielectric layer 108, and a poly-silicon and/or metal layer 115. Gate dielectric layer 108 is deposited over a portion of well region 111, substrate layer 102, drift region 110, and STI region 106. Gate dielectric layer 108 is deposited utilizing a chemical vapor deposition (CVD) process or any other conventional process for depositing dielectric material. In addition, gate dielectric layer 108 can include oxide, nitride, or any other practical dielectric material. Poly-silicon and/or metal layer 115 is deposited on gate dielectric layer 108 utilizing a CVD process, or any other practical deposition process. Specifically, if gate 116 includes a metal layer then the metal layer can include hafnium, zirconium, or tantalum.

Figure 1F:
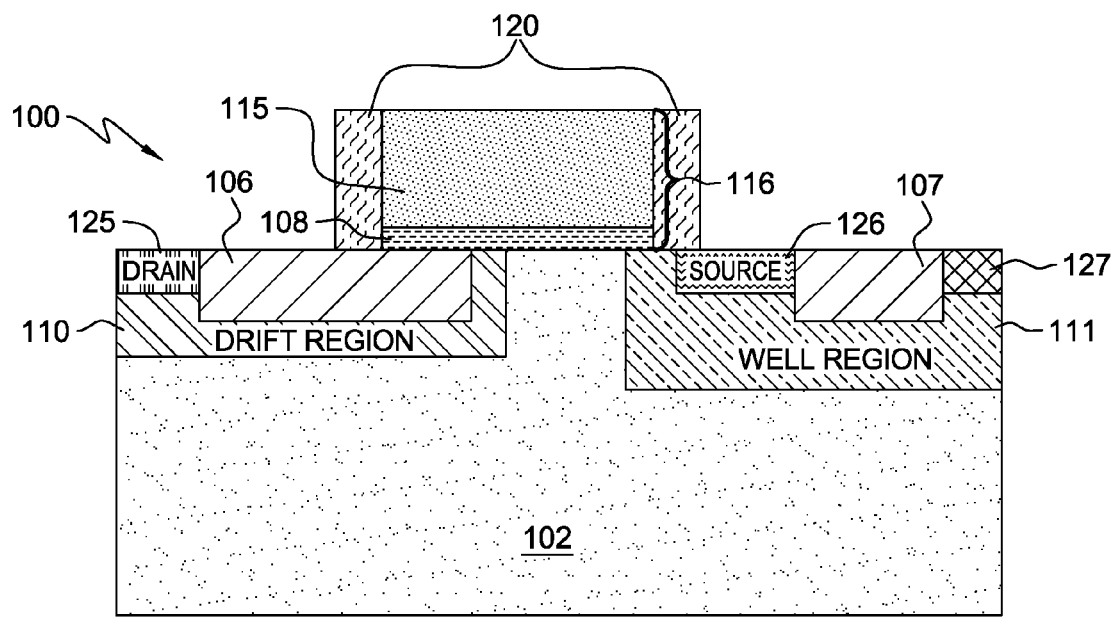

FIG. 1F illustrates the formation of sidewall spacers 120, drain region 125, source region 126, and body contact region 127. Sidewall spacers 120 are formed adjacent to gate 116, and overlap a portion of STI region 106 and source region 126. Drain region 125, source region 126, and body contact region 127 can be created by performing a diffusion implant technique such as ion implantation and/or in-situ doping during epitaxial growth. If semiconductor 100 is an n-type LDMOS transistor then substrate layer 102 is p-type doped, drain region 125 is n-type doped, source region 126 is n-type doped, and body contact region 127 is p-type doped. However, if semiconductor 100 is a p-type LDMOS transistor then substrate layer 102 is p-type doped, drain region 125 is p-type doped, source region 126 is p-type doped, and body contact region 127 is n-type doped. In the present embodiment, semiconductor 100 is an n-type LDMOS transistor, so substrate layer 102 is p-type doped, drain region 125 and source region 126 are formed utilizing n-type dopants, and body contact region 127 is formed utilizing p-type dopants. Moreover, silicide contacts can be formed over drain region 125, source region 126, and gate 116 to provide for connectivity to back-end wiring.

Figure 1G:
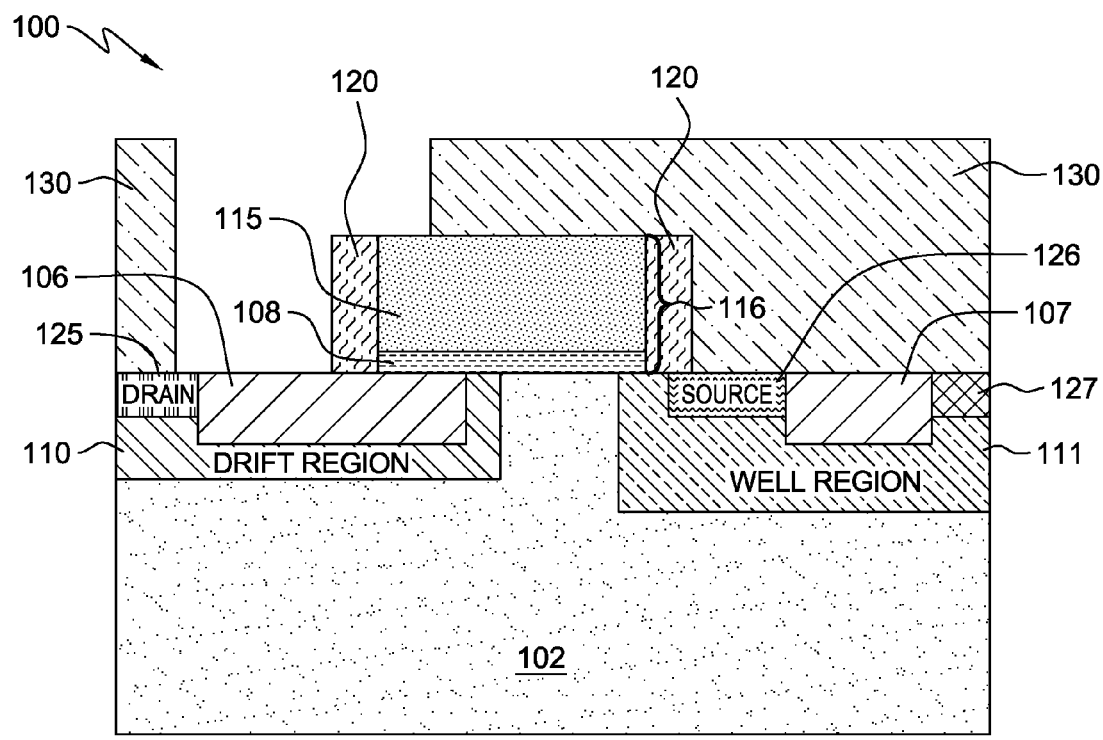

FIG. 1G illustrates the formation of a photoresist layer 130 disposed over a portion of drain region 125, a portion of gate 116, a portion of sidewall spacers 120, source region 126, STI region 107, and body contact region 127. Accordingly, part of drain region 125, STI region 106, sidewall spacers 120, and gate 116 can be exposed (i.e., not covered by the photoresist layer 130). Although, body contact region 127 is shown in a two-dimensional well region 111, the well region is actually three-dimensional. Thus, body contact region 127 may be formed in a third dimension at another location in well region 111.

Figure 1H:
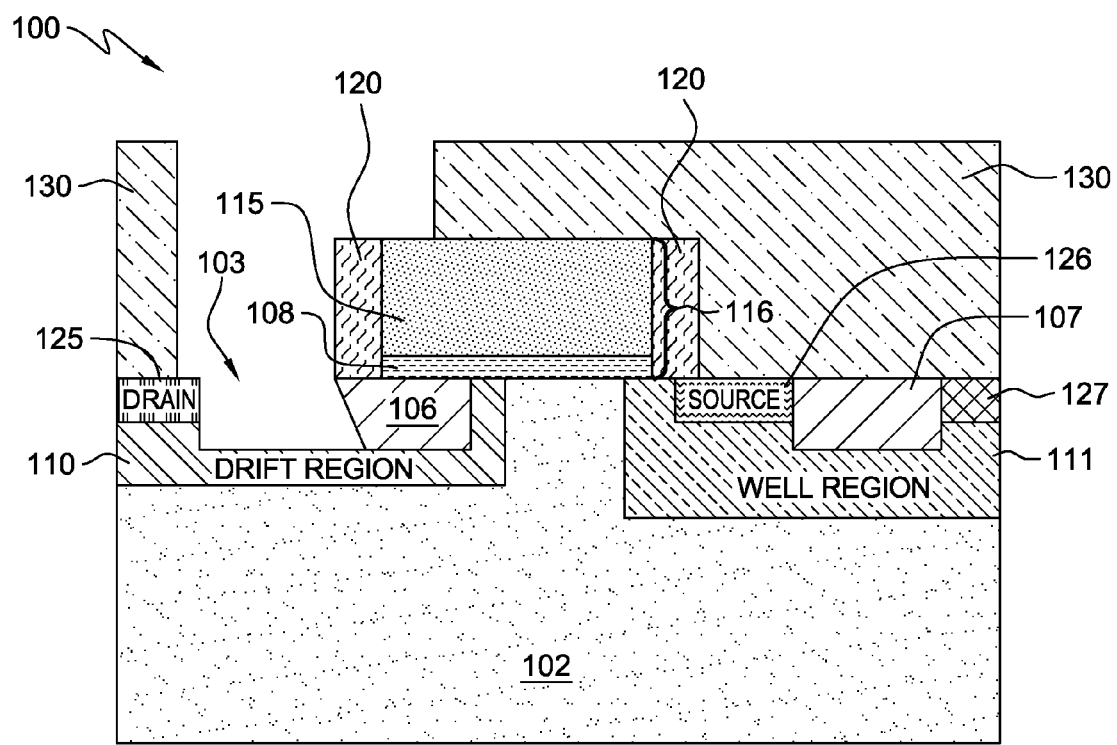

Subsequently, in FIG. 1H a portion of the oxide that forms STI region 106, in opening 103 (also shown in FIG. 1A), is removed to clear the way for deposition of stress layer 135 (shown below in FIG. 1I) over the STI region. Specifically, anisotropic reactive ion etching (RIE) may be utilized to remove the oxide from opening 103, but any other practical etching method may be utilized.

Figure 1I:
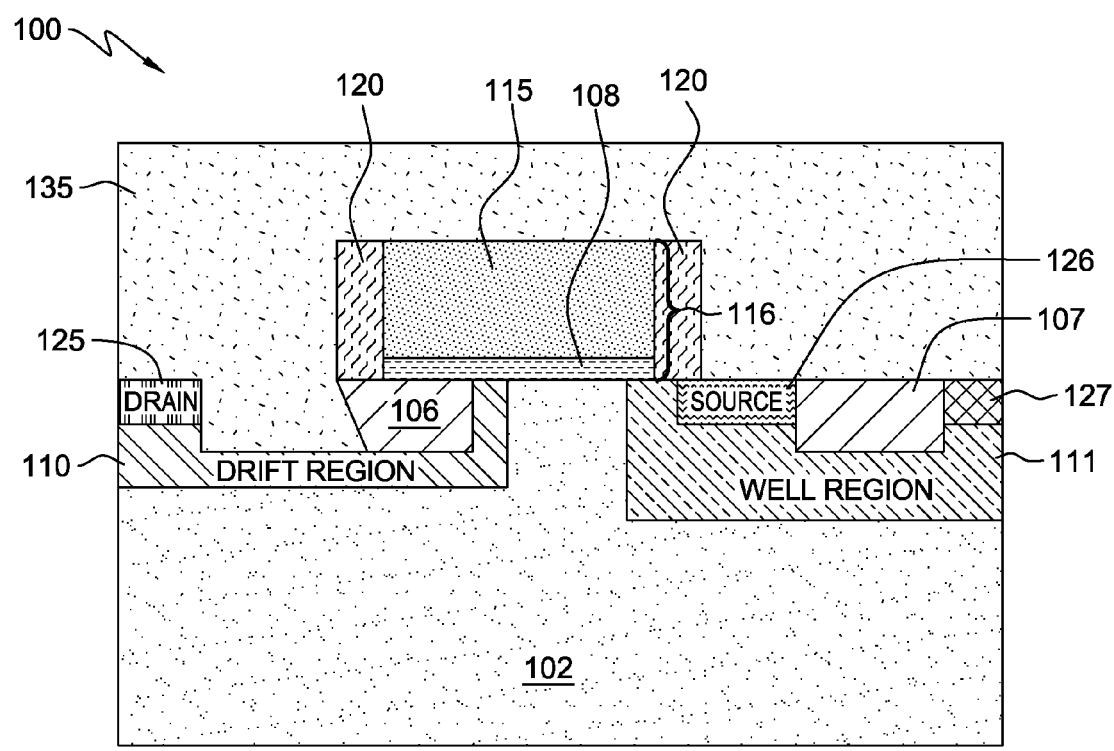

FIG. 1I illustrates formation of a stress layer 135 deposited over drain region 125, drift region 110, sidewall spacers 120, gate 116, source region 126, STI region 107, and body contact region 127. Stress layer 135 is a nitride insulator providing either compressive or tensile stress to portions of drift region 110. Nitride stress layer 135 is deposited over semiconductor 100 to provide either compressive stress or tensile stress, which depends on whether the semiconductor is an n-type or p-type semiconductor. Moreover, plasma-enhanced chemical vapor deposition (PECVD) is utilized to deposit nitride stress layer 135, over semiconductor 100, with compressive stress or tensile stress. Compressive stress can enhance the mobility of holes in a p-type semiconductor, because the stress is applied in the direction that holes move through the drift region 110. Tensile stress can enhance the mobility of electrons in an n-type semiconductor, because the stress is applied in the direction that electrons move through the drift region 110. In the present embodiment, semiconductor 100 is an n-type LDMOS, so stress layer 135 is utilized to provide tensile stress in drift region 110 to increase the mobility of electrons. In alternative embodiments, semiconductor 100 may be a p-type LDMOS, wherein stress layer 135 is utilized to provide compressive stress to increase the mobility of holes.

Figure 1J:
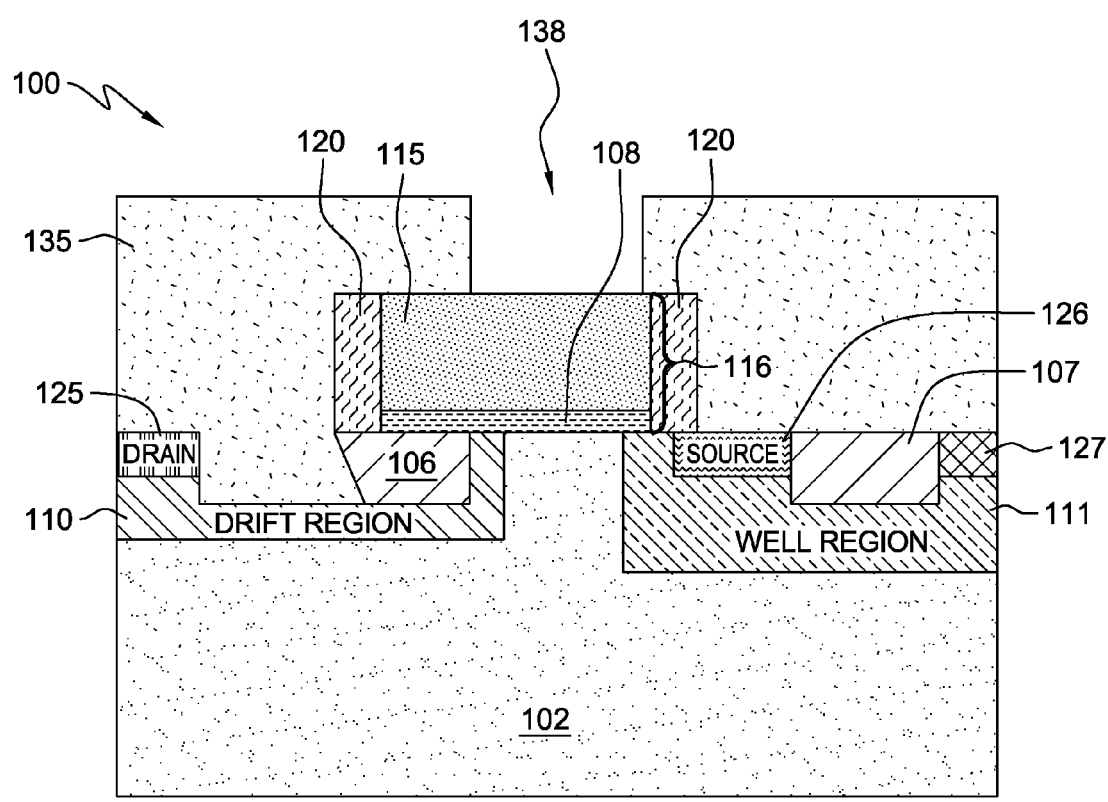

In FIG. 1J, a portion of stress layer 135 can be removed above gate 116, which forms an opening 138 and allows compressive or tensile stress to propagate down into the region below the gate (i.e., the inversion region), depending on the polarity of the stress layer. Stress layer 135 can be a nitride layer wherein the pressure utilized in forming the stress layer is adjusted during use of PECVD, or any other practical deposition technique such that the stress layer can provide stress of about 1 GPa. In the present embodiment, semiconductor 100 is an n-type LDMOS transistor, formed utilizing a p-type doped substrate layer 102. However, an n-type LDMOS can be fabricated utilizing an n-band well region.

Figure 1K:
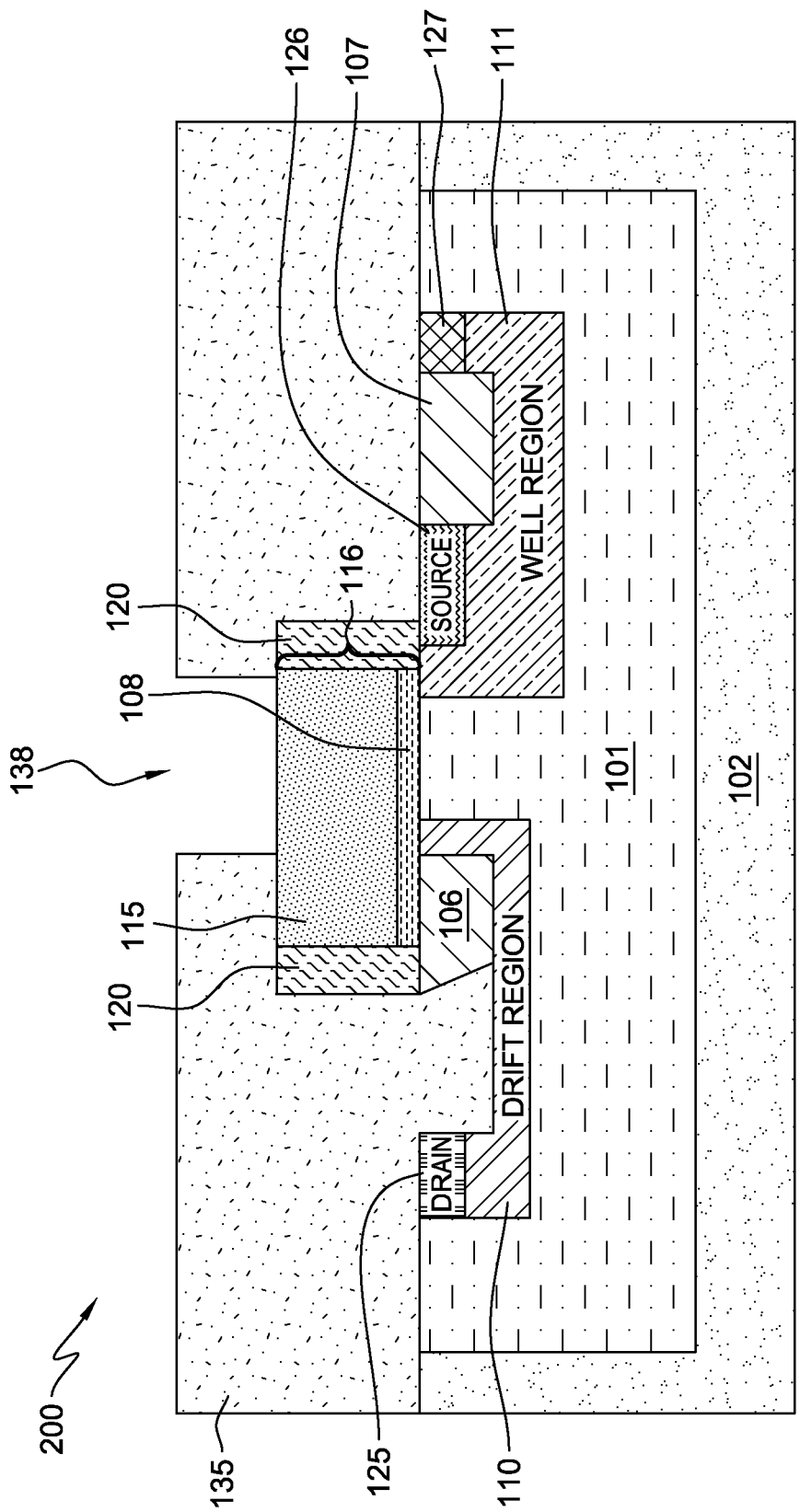
FIG. 1K is a cross-sectional view of semiconductor structures fabricated utilizing an n-band well region.

FIG. 1K illustrates an alternative embodiment, wherein a semiconductor 200 is an n-type LDMOS that is formed utilizing an n-band well region 101. Semiconductor 200 includes a substrate layer 102, an n-band well region 101, a well region 111, a source region 126, a body contact region 127, a drift region 110, a drain region 125, STI regions 106 and 107, sidewall spacers 120, a gate 116 having a gate dielectric layer 108 and a poly-silicon and/or metal layer 115, a stress layer 135, and an opening 138 in the stress layer. Moreover, well region 111 is p-type doped, n-band well region 101 is n-type doped, and substrate layer 102 is p-type doped. N-band well region 101 can be n-type in-situ doped, n-type doped utilizing ion implantation, or n-type doped utilizing any other known conventional doping technique. Furthermore, if semiconductor 200 is an n-type LDMOS, then the purpose of n-band well region 101 is to isolate well region 111 from substrate layer 102. Lastly, semiconductor 200 can be a p-type LDMOS transistor that is formed utilizing a well region 111 that is n-type doped, a substrate layer 102 that is p-type doped, and an n-band well region 101 that is n-type doped. Specifically, for a p-type LDMOS n-band well region 101 can be n-type in-situ doped, n-type doped utilizing ion implantation, or n-type doped utilizing any other known conventional doping technique. In addition, if semiconductor 200 is a p-type LDMOS, then the purpose of n-band well region 101 is to isolate drift region 110 that is p-type doped, from substrate layer 102 that is p-type doped.

Furthermore, those skilled in the art will note from the above description, that presented herein is a novel structure and method to form a lateral diffused metal-oxide-semiconductor field effect transistors (LDMOS transistors) utilizing a stress layer to reduce on-resistance and maintain higher breakdown voltages for the LDMOS transistors. Lastly, the foregoing description of various aspects of the invention has been presented for purposes of illustration and description. It is not intended to be exhaustive or to limit the invention to the precise form disclosed and, obviously, many modifications and variations are possible. Such modifications and variations that may be apparent to a person skilled in the art are intended to be included within the scope of the invention as defined by the accompanying claims.

What is claimed is:

1. A semiconductor device comprising:
   a substrate;
   a well region formed in the substrate;
   a first shallow trench isolation region formed on and adjacent to the well region, wherein the first shallow trench isolation region is proximate to a body contact doped with the dopants of a first polarity type;
   a source region formed on the well region and adjacent to the first shallow trench isolation region;
   a drift region formed in the substrate adjacent to the well region;
   a second shallow trench isolation region formed on and adjacent to the drift region;
   a drain region formed on the drift region and adjacent to the second shallow trench isolation region;
   a gate formed between the source region and the drain region;
   a sidewall spacer formed adjacent to sidewalls of the gate; and
   a stress layer deposited over the semiconductor device, wherein the stress layer is also deposited inside the second shallow trench isolation region, and wherein the stress layer is proximate to the drift region.

2. The semiconductor device of claim 1, wherein:
   the semiconductor device is a lateral diffused metal-oxide-semiconductor field effect transistor;
   the substrate is doped with dopants of the first polarity type.

3. The semiconductor device of claim 2, wherein:
   the well region is doped with the dopants of the first polarity type, and the well region further comprises the body contact; and
   the source region, drift region, and drain region are doped with dopants of a second polarity type.

4. The semiconductor device of claim 3, wherein the first shallow trench isolation region and the second shallow trench isolation region comprise dielectric material, which includes oxide, nitride, or any other dielectric material.

5. The semiconductor device of claim 4, wherein a portion of the dielectric material in the second shallow trench isolation region is removed utilizing one or more processes which include anisotropic reactive ion etching (RIE), or any other practical etching method.

6. The semiconductor device of claim 5, wherein the gate further comprises a gate dielectric layer, a metal layer, and a polycrystalline silicon (poly) layer.

7. The semiconductor device of claim 6, wherein:
   the stress layer is deposited utilizing plasma-enhanced chemical vapor deposition to provide stress of about 1 GPa; and
   the stress layer comprises silicon nitride.

8. The semiconductor device of claim 7, wherein a portion of the stress layer over the semiconductor device is removed to form an opening, which propagates stress of about 1 GPa into the region below the gate to enhance the flow of current through the semiconductor device.

9. The semiconductor device of claim 8, wherein:
the gate dielectric and the sidewall spacer further comprise oxide, nitride, or any other dielectric material; and
contacts comprising silicide are formed on a portion of the drain region, gate, and source region.

10. The semiconductor device of claim 9, wherein the dopants of the first polarity type for the well region and for the body contact are interchanged with the dopants of the second polarity type for the source region, drift region, and drain region.

11. The semiconductor device of claim 10, wherein:
the drift region is formed on and adjacent to an n-band well region; and the n-band well region is formed in the substrate, which is doped with one of a group of n-type dopants that include phosphorus, arsenic, or antimony.

* * * * *